United States Patent
Hasegawa et al.

(10) Patent No.: US 7,653,099 B2
(45) Date of Patent: Jan. 26, 2010

(54) SEMICONDUCTOR LASER DEVICE WHICH IS CAPABLE OF STABLY EMITTING SHORT-WAVELENGTH LASER LIGHT

(75) Inventors: Yoshiaki Hasegawa, Osaka (JP); Toshiya Yokogawa, Nara (JP); Hiroyoshi Yajima, Kanagawa (JP)

(73) Assignee: Panasonic Corporation, Kadoma (JP)

( * ) Notice: Subject to any disclaimer, the term of this patent is extended or adjusted under 35 U.S.C. 154(b) by 221 days.

(21) Appl. No.: 11/569,683

(22) PCT Filed: Jun. 2, 2005

(86) PCT No.: PCT/JP2005/010129

§ 371 (c)(1),
(2), (4) Date: Nov. 28, 2006

(87) PCT Pub. No.: WO2005/119862

PCT Pub. Date: Dec. 15, 2005

(65) Prior Publication Data

US 2008/0049800 A1 Feb. 28, 2008

(30) Foreign Application Priority Data

Jun. 2, 2004 (JP) .............................. 2004-164061

(51) Int. Cl.
*H01S 3/04* (2006.01)
*H01L 23/45* (2006.01)

(52) U.S. Cl. ........................................ 372/34; 174/540

(58) Field of Classification Search .................. 372/34; 174/540
See application file for complete search history.

(56) References Cited

U.S. PATENT DOCUMENTS 5,922,250 A 7/1999 Ishikawa et al.

(Continued)

FOREIGN PATENT DOCUMENTS

JP 01-133387 5/1989

(Continued)

OTHER PUBLICATIONS

International Search Report for corresponding Application No. PCT/JP2005/010129 mailed Jul. 26, 2005.

*Primary Examiner*—Minsun Harvey
*Assistant Examiner*—Marcia A. Golub
(74) *Attorney, Agent, or Firm*—Renner, Otto, Boisselle & Sklar, LLP (57) ABSTRACT

A semiconductor laser device according to the present invention includes: a semiconductor laser chip 1 for emitting laser light; a stem 3, 4 for supporting the semiconductor laser chip; a plurality of terminal electrodes, inserted in throughholes provided in the stem 3, 4, for supplying power to the semiconductor laser chip; and a cap 5 having an optical window 6 which transmits laser light and being affixed to the stem 3, 4 so as to cover the semiconductor laser chip 1. Between the stem 3, 4 and the terminal electrodes 7, this device includes insulation glass 8, which does not release silicon fluoride gas when heated to a temperature of no less than 700° C. and no more than 850° C.

10 Claims, 8 Drawing Sheets

U.S. PATENT DOCUMENTS

| | | |
|---|---|---|
| 6,396,023 B1 | 5/2002 | Aikiyo |
| 6,587,491 B1 | 7/2003 | Yamamoto |
| 2002/0049127 A1 | 4/2002 | Takano et al. |
| 2003/0214987 A1 | 11/2003 | Yamanaka et al. |
| 2005/0074039 A1 | 4/2005 | Kuramachi et al. |
| 2005/0153478 A1 | 7/2005 | Yoshida et al. |
| 2005/0242359 A1 | 11/2005 | Yoshia et al. |

FOREIGN PATENT DOCUMENTS

| | | |
|---|---|---|
| JP | 11-150218 | 6/1999 |
| JP | 2003-059087 | 2/2003 |
| JP | 2004-022918 | 1/2004 |
| JP | 2004-252425 | 9/2004 |
| JP | 2004-273908 | 9/2004 |

SEMICONDUCTOR LASER DEVICE WHICH IS CAPABLE OF STABLY EMITTING SHORT-WAVELENGTH LASER LIGHT

TECHNICAL FIELD

The present invention relates to a semiconductor laser device and a method for producing the same.

BACKGROUND ART

In order to increase the recording capacity of an optical disk, it is necessary to reduce the wavelength of laser light which is required for data read/write. In currently prevalent DVD players or recorders, red semiconductor lasers having a wavelength band of 660 nm are widely used. Such a red semiconductor laser is produced, for example, epitaxially growing an InGaAlP-type compound semiconductor on a GaAs substrate.

In recent years, vigorous development efforts are directed to next-generation optical disks, in order to realize an increased recording capacity over that of the DVD. A light source for such a next-generation optical disk will be required to stably emit blue-violet laser light (wavelength band 400 nm), whose wavelength is even shorter than that of red light. A GaN-type semiconductor laser of the wavelength band of 400 nm is considered as a most promising light source for the recording/reproduction of next-generation optical disks such as the Blu-ray Disc (trademark).

Patent Document 1 discloses a semiconductor laser device which is suitably used as a short wavelength light source in an optical disk apparatus.

[Patent Document 1] Japanese Laid-Open Patent Publication No. 2003-59087

DISCLOSURE OF INVENTION

Problems to be Solved by the Invention

In order to be able to practically realize a semiconductor laser device which is capable of stably emitting laser light of a wavelength shorter than that of red light for long periods of time, there are several problems to be solved. Among others, it is strongly desired to further enhance the reliability of a semiconductor laser device, and achieve a lifespan which is sufficiently long for practice use. However, the inventors have found that, while operating a semiconductor laser chip (which emits blue-violet laser light) in an airtight-sealed state using a cap, the device life is greatly shortened depending on the types of stem and caps.

The present invention has been made in order to solve the aforementioned problems, and aims to provide a semiconductor laser device which achieves a long life and is capable of stably emitting short-wavelength laser light, as well as provide a method for producing the same.

Means for Solving the Problems

A semiconductor laser device according to the present invention comprises: a semiconductor laser chip for emitting laser light; a stem for supporting the semiconductor laser chip; a plurality of terminal electrodes, inserted in throughholes provided in the stem, for supplying power to the semiconductor laser chip; a cap having an optical window which transmits laser light and being affixed to the stem so as to cover the semiconductor laser chip; and insulation glass provided between the stem and the terminal electrodes, wherein, a total amount of silicon fluoride gas which is released when the insulation glass is heated to a temperature of no less than 700° C. and no more than 850° C. is equal to or less than 1.0 μg.

In a preferred embodiment, an ambient gas which comes in contact with the semiconductor laser chip is contained inside a space enclosed by the stem and the cap; and in the insulation glass, a concentration of silicon fluoride at a surface which is in contact with the ambient gas is lowered than a concentration of silicon fluoride in the interior of the insulation glass.

In a preferred embodiment, the insulation glass does not contain silicon fluoride.

In a preferred embodiment, an interval between an inner peripheral edge of the cap and an outer peripheral surface of the insulation glass is equal to or less than 50 μm.

In a preferred embodiment, a wavelength of the laser light is equal to or less than 500 nm.

In a preferred embodiment, in the insulation glass, a concentration of silicon fluoride at a surface which is in contact with the ambient gas is 1/10 or less of a concentration of silicon fluoride in the interior of the insulation glass.

In a preferred embodiment, the ambient gas is nitrogen gas and/or inert gas.

In a preferred embodiment, the ambient gas contains oxygen gas.

An optical disk apparatus according to the present invention comprises: any of the aforementioned semiconductor laser devices; and an optical system for converging laser light which is emitted from the semiconductor laser device onto an optical disk.

In a preferred embodiment, in any region which is irradiated with the laser light, no element is provided that is formed of a material containing a substance which undergoes a photochemical reaction responsive to laser light.

A method for producing a semiconductor laser device is a method for producing a semiconductor laser device including: a semiconductor laser chip for emitting laser light; a stem for supporting the semiconductor laser chip; a plurality of terminal electrodes, inserted in throughholes provided in the stem, for supplying power to the semiconductor laser chip; and a cap having an optical window which transmits laser light and being affixed to the stem so as to cover the semiconductor laser chip, comprising: step (A) of insulating the terminal electrodes from the stem with insulation glass which does not release silicon fluoride gas when heated to a temperature of no less than 700° C. and no more than 850° C.; and step (B) of affixing the cap to the stem.

In a preferred embodiment, between step (A) and step (B), a step of washing a surface of the stem and the cap with hexane is performed.

In a preferred embodiment, between step (A) and step (B), a step of irradiating a surface of the stem and the cap with light having a wavelength equal to or less than 500 nm is performed.

EFFECTS OF THE INVENTION

According to the present invention, a semiconductor laser device which emits laser light of a wavelength equal to or less than 500 nm achieves a long life.

BRIEF DESCRIPTION OF DRAWINGS

FIG. 6 (a) is a cross-sectional SEM (scanning electron microscopic picture); and (b) is a schematic representation of the cross-sectional SEM image of (a).

FIGS. 7 (a) and (b) are plan views showing upper faces of the bases of an I-cut type package and a half-cut type package, respectively.

FIG. 8 (a) is a graph showing the relationship between a heating temperature of low-melting point insulation glass to which $SiF_x$ has been added in order to lower its melting point and the detected intensities of Si-containing substances (SiOH, $SiF_x$) as emitted from this insulation glass; and (b) is a graph showing the relationship between a heating temperature of a high-melting point insulation glass which does not contain $SiF_x$ and the detected intensities of Si-containing substances (SiOH, $SiF_x$) as emitted from this high-melting point insulation glass.

DESCRIPTION OF THE REFERENCE NUMERALS 1 laser chip
2 submount
3 heat sink (stem)
4 base (stem)
5 cap
6 optical window
7 terminal electrode
8 insulation glass
10 adhesion layer of low-melting point glass
10a low Si-concentration region
10b low Si-concentration region
20 shielding film
50 UV light source

BEST MODE FOR CARRYING OUT THE INVENTION

Figure 6:
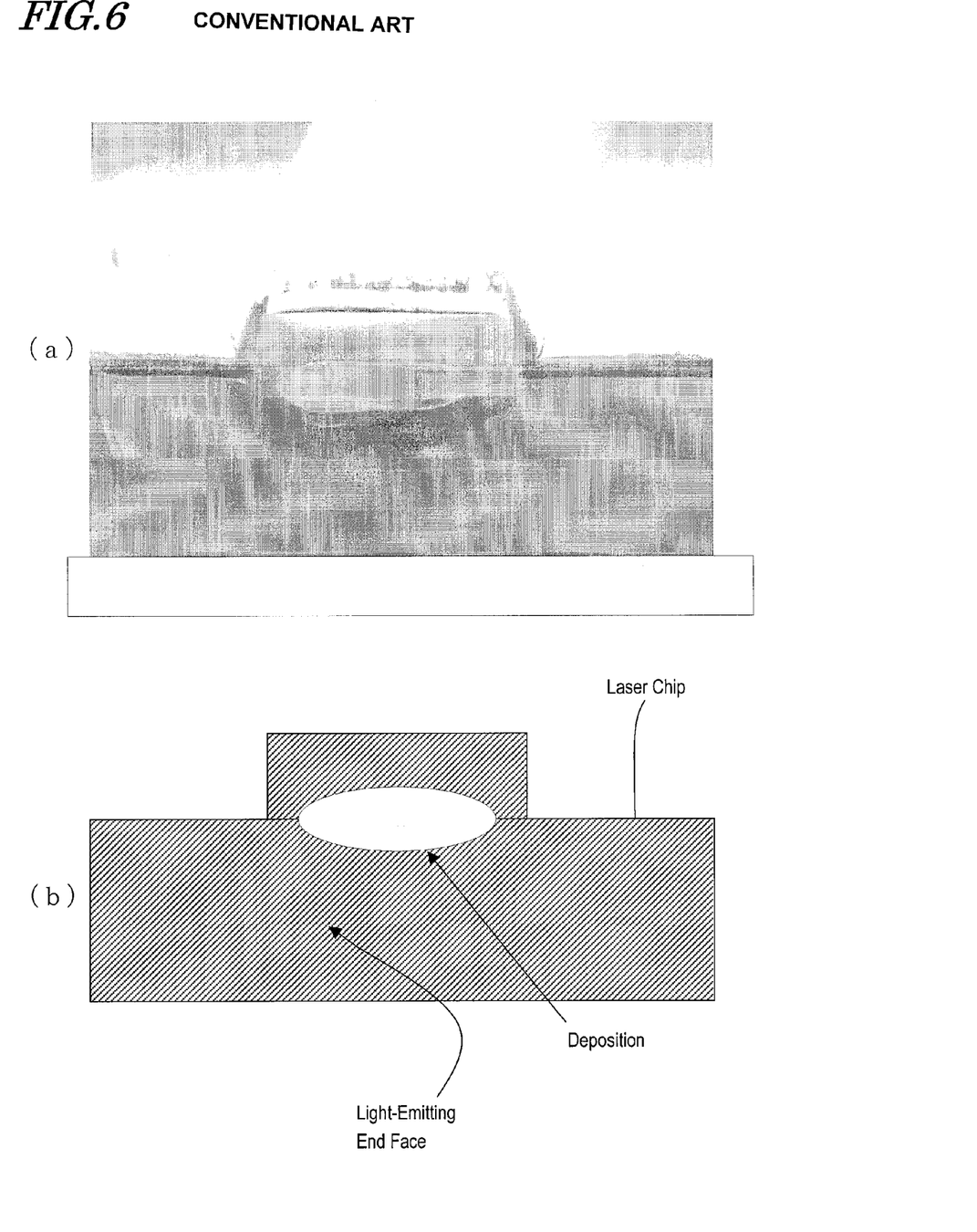

As a result of closely observing a deteriorated light-emitting end face of a semiconductor laser chip (hereinafter referred to as a "laser chip"), it was found that a cause of deterioration of a semiconductor laser device is, as shown in FIGS. 6(a) and (b), the deposition of "foreign matter" in an emission region on the light-emitting end face. No such deterioration may occur depending on the semiconductor laser device. At first, the reason for the deposition on the light-emitting end face of a laser chip was unknown.

Upon analyzing the foreign matter having deposited on the light-emitting end face, it was confirmed that a large amount of Si (silicon) was contained in the deposition, and that the Si in the deposition derives from Si-containing elements (especially Si-containing low-melting point glass) which are used for assembling a package for covering the laser chip.

Although such Si-containing elements have also been employed in semiconductor laser devices for emitting red light, no deterioration phenomenon characterized by the deposition of a foreign matter containing a large amount of Si on the light-emitting end face of the laser chip has been observed in that case. Therefore, it can be seen that an Si-containing element does not cause the aforementioned deterioration phenomenon when irradiated with laser light having a wavelength longer than 500 nm. On the other hand, the aforementioned deterioration phenomenon is considered to occur in the case of laser light of a short wavelength (500 nm or less, and typically 420 nm or less), such as blue laser light. Specifically, when receiving short-wavelength laser light having a wavelength equal to or less than 500 nm, an Si-containing element undergoes a photochemical reaction, and thus supplies in the ambient gas a substance (mainly Si) which causes the deposition. It is further considered that laser light of such a short wavelength also contributes in causing the foreign matter to be deposited in the emission region on the light-emitting end face.

Although the exact mechanism of the photochemical reaction caused by short-wavelength laser light has not been clear, we have confirmed that the problem of end face deterioration due to Si-containing foreign matter can be solved by eliminating Si-containing elements from any portion which is irradiated with laser light.

Furthermore, the inventors have also found that, besides the method of solving the end face deterioration problem by eliminating Si-containing elements from any region irradiated with laser light of a wavelength equal to or less than 500 nm, the following means of solution can be adopted to solve the end face deterioration problem.

(1) By irradiating an Si-containing element with light (e.g., ultraviolet light) having a wavelength which is equal to or less than the wavelength of the laser light prior to sealing, Si or Si-containing substance is caused to be released from a portion of the Si-containing element, whereby the Si concentration at the surface of the Si-containing element is lowered. As a result, in the Si-containing element, the concentration of the aforementioned substance at the surface which will come in contact with the gas within a package is lowered than the Si concentration in the interior of the Si-containing element. Therefore, after sealing, releasing of Si or Si-containing substance into the package can be suppressed even when irradiated with laser light.

(2) The surface of an Si-containing element is coated with a film composed of a stable material which will not undergo photochemical reaction upon laser light irradiation. Such a film is formed of a material similar to the coating film which is used for coating the end face of the laser chip, for example, but may be a film which absorbs or reflects the laser light. By coating the Si-containing element with a film which absorbs or reflects the laser light, the photochemical reaction induced by laser light can be suppressed, and it is also possible to obtain an effect of shielding the Si-containing element from the ambient gas and confining within the Si-containing element any substance that is responsible for the foreign matter.

Embodiment 1

Hereinafter, embodiments of the semiconductor laser device according to the present invention will be described.

Figure 1:
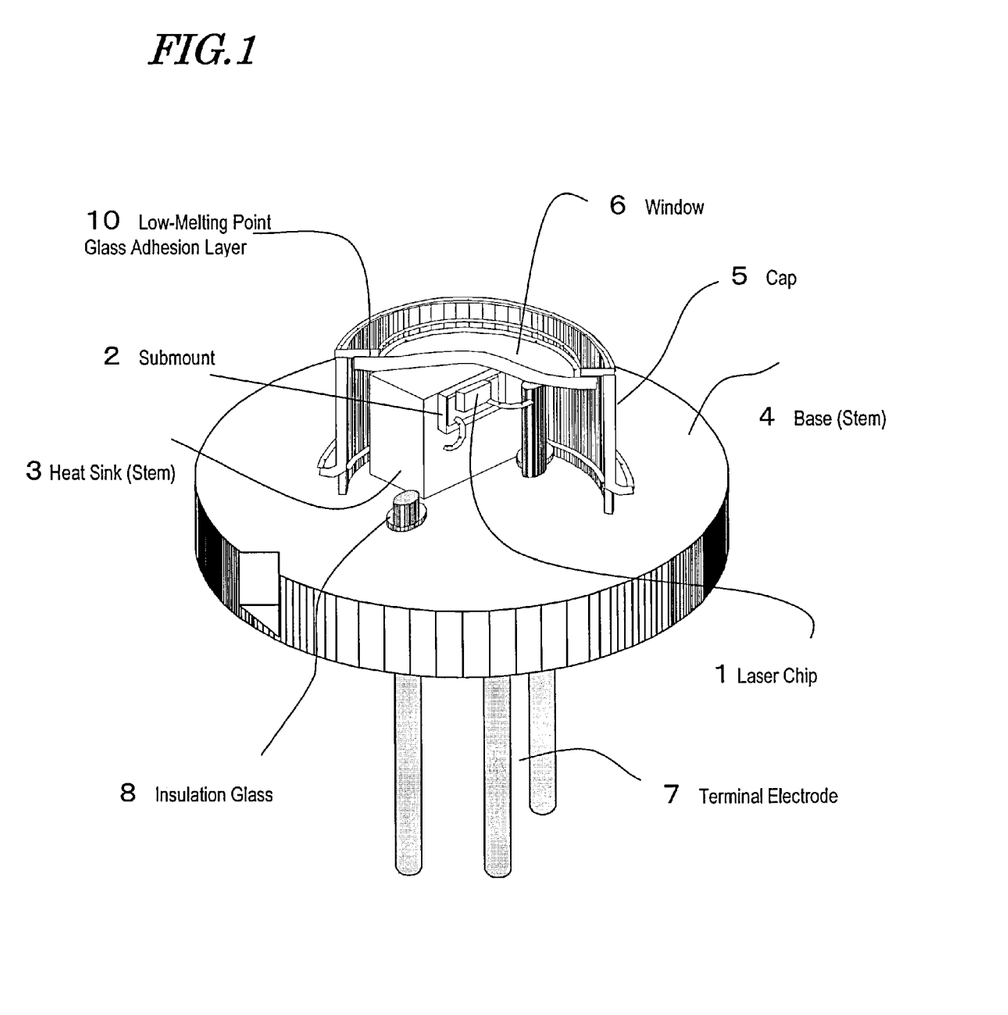
FIG. 1 A partially-exploded perspective view schematically showing the structure of a semiconductor laser device according to an embodiment of the present invention.

FIG. 1 is a partially-exploded perspective view schematically showing the structure of a semiconductor laser device of the present embodiment. The semiconductor laser device shown is a can-type laser which comprises: a laser chip 1 for emitting blue-violet laser light having a wavelength of 405 nm; a submount 2 on which the laser chip 1 is mounted; a heat sink 3 on which the submount 2 is affixed; a cap 5 covering the laser chip 1; and a base 4 for supporting the heat sink 3 and the cap 5. As a whole, the heat sink 3 and the base 3 constitute a "stem".

The laser chip 1, which is a laser diode device having a rectangular shape such that width 350 μm×length (cavity length) 700 μm×thickness 100 μm, has a multilayer structure of nitride semiconductor which is epitaxially grown on a substrate of e.g. GaN, SiC or sapphire. As for the composition and layer thicknesses of the nitride semiconductor composing the multilayer structure, any known constitution may be adopted. The laser chip 1 of the present embodiment includes an active layer having a quantum well structure, in which $In_{0.1}Ga_{0.9}N$ quantum well layers with a thickness of 3 nm and $In_{0.02}Ga_{0.98}N$ barrier layers with a thickness of 9 nm are stacked alternately, such that an oscillation wavelength of 405 nm is obtained.

The submount 2 is a block-like element formed of a material having a high thermal conductivity (e.g. SiC or AlN), and has a function of quickly dissipating the heat which is generated in the laser chip 1 to the heat sink 3 and the base 4.

The cap 5 is formed of a metal material such as mild steel, and has a generally cylindrical shape. In an opening formed in its upper end face, an optical window (cap glass) 6 which transmits laser light that is emitted from the laser chip 1 is attached. The cap 5 is affixed (fused) to the upper face of the base 4 via high electric-field press or the like.

The base 4, which is preferably formed of a metal material such as copper or iron, has a plurality of terminal electrodes (lead pins) 7 fixed thereto. The terminal electrodes 7 are electrically connected to terminal electrodes (not shown) of the laser chip 1 via bonding wires or the like. An electric current is supplied from an external driving circuit to the laser chip 1 via the terminal electrodes 7, causing laser oscillation within the laser chip 1. Between the terminal electrodes 7 and the base 4, insulation glass 8 for electrically insulating the terminal electrodes 7 from the base 4 is provided.

Figure 2:
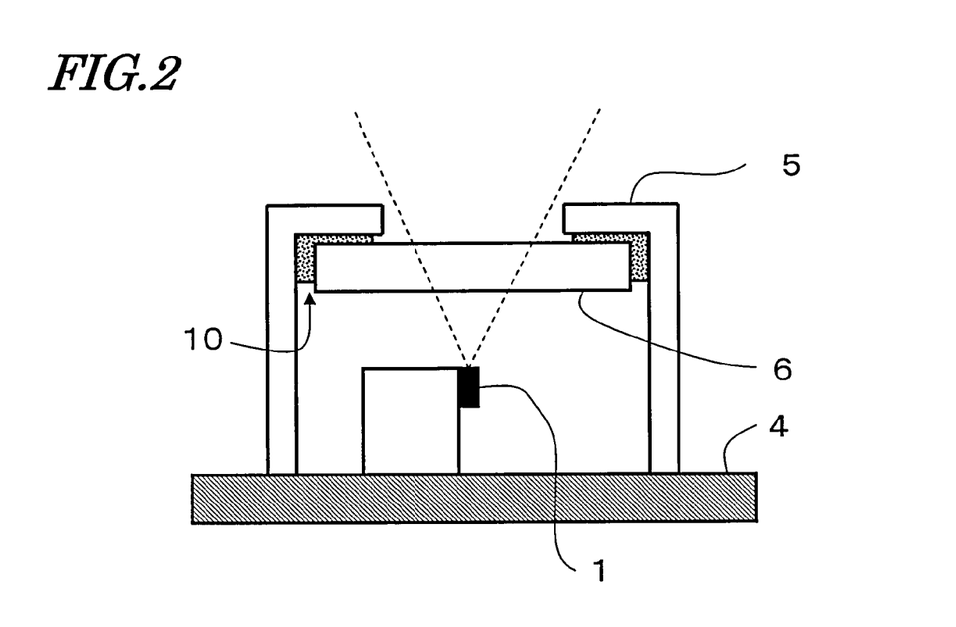
FIG. 2 A cross-sectional view showing a main portion of a semiconductor laser device according to Embodiment 1.

FIG. 2 is a cross-sectional view showing a main portion of the semiconductor laser device of the present embodiment.

As shown in FIG. 2, the optical window 6 which transmits laser light is formed of a disk-like glass plate sized so as to have a thickness of about 0.25 mm and a diameter of about 3.1 mm, and is adhered to an inner wall surface of the cap 5 via a layer of low-melting point glass (hereinafter referred to as an "adhesion layer") 10.

The space which is enclosed by the cap 5, the base 4, and the optical window 6 accommodates the laser chip 1, in an isolated state from the atmosphere. Therefore, the cap 5, the base 4, and the optical window 6 can be regarded as composing a single "package" for the laser chip 1. In the internal space of this package, inert gas such as nitrogen is enclosed.

In the present embodiment, the adhesion layer 10 of low-melting point glass, which causes the optical window 6 to adhere to the cap 5, is formed of a material containing a substance which undergoes a photochemical reaction responsive to laser light (Si or Si-containing substance). Such an adhesion layer 10 of low-melting point glass is formed by using, for example, low-melting point powder glass which has been processed into tablets for convenient adhesion. The tablets of powder glass are formed by mixing powder glass with a binder resin and thereafter performing sintering. Although the binder resin is to be removed in a heating step (binder-removing step) which precedes sintering, a portion of the resin remains in the adhesion layer 10.

Figure 3:
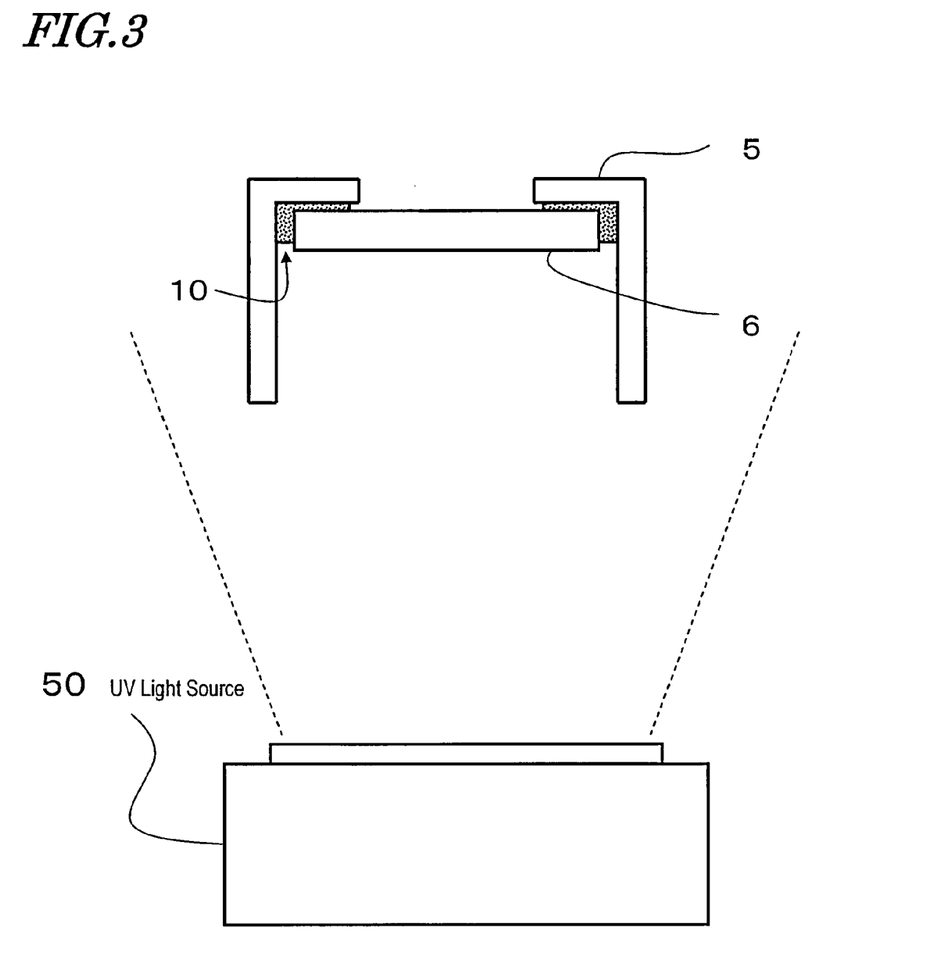
FIG. 3 A diagram showing a cleaning process via ultraviolet irradiation.

In the present embodiment, out of the adhesion layer 10 of low-melting point glass, in order to lower the concentration of the Si-containing substance at least at the surface which comes in contact with the ambient gas, ultraviolet light (UV) irradiation is performed by using a UV light source 50, as shown in FIG. 3. The wavelength of this ultraviolet light is in the range from about 200 to about 350 nm, the wavelength being about equal to or shorter than that of the light which is emitted from the laser chip 1. The irradiation time of ultraviolet light is set in the range from 10 to 60 minutes, for example.

By irradiating the adhesion layer 10 of low-melting point glass with such short-wavelength light, the Si or Si-containing substance is gasified and released from the adhesion layer 10. Since the cap 3 has not yet been attached to the base 4 when ultraviolet irradiation is to be performed, the substance which is released from the adhesion layer 10 is allowed to go into the atmosphere.

Figure 4:
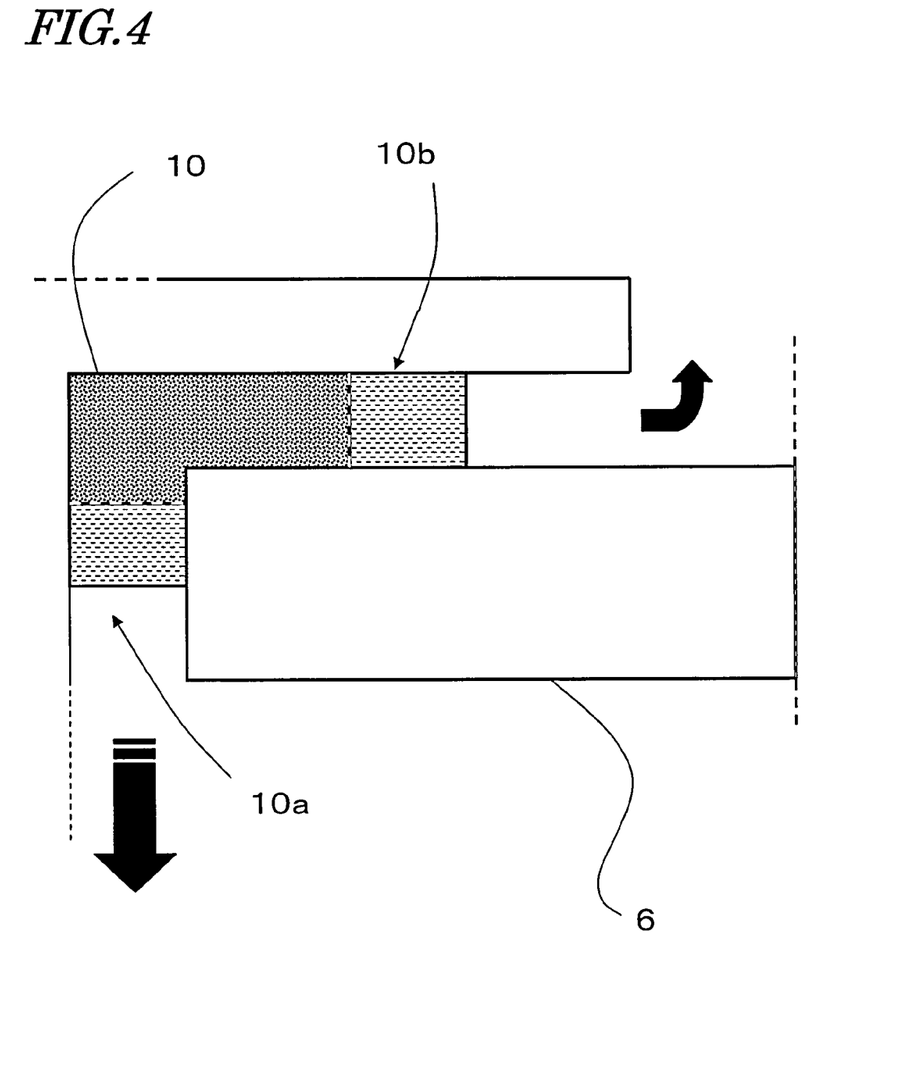
FIG. 4 A partial cross section schematically showing a state where Si has been released from an adhesion layer 10 to form a low Si-concentration region.

By performing adequate ultraviolet irradiation for the adhesion layer 10, as shown in FIG. 4, regions 10a and 10b whose Si concentration is lowered relative to that of any other portion in the adhesion layer 10 can be formed. Hereinafter, the regions 10a and 10b will be referred to as "low Si-concentration regions". It is preferable that the low Si-concentration regions 10a and 10b have an Si concentration which is 1/10 or less of that in the interior of the adhesion layer 10.

The thick black arrows in FIG. 4 schematically show a manner in which Si (or Si-containing substance, e.g. Si compound) is separated from the adhesion layer 10 through ultraviolet irradiation.

When a semiconductor laser device as shown in FIG. 2 was assembled by using the cap 3 which had been subjected to such an ultraviolet irradiation treatment, the problem of Si depositing on the light-emitting end face of the laser chip 1 to cause deterioration of the laser characteristics hardly occurred, even though the adhesion layer 10 was irradiated with the laser light emitted from the laser chip 1 during operation of the semiconductor laser device, or scattered light (stray light) thereof. Thus, the semiconductor laser device can attain a long life even when low-melting point glass which contains Si is used as the adhesion layer 10.

Note that the distribution of Si concentration in the adhesion layer 10 does not need to drastically change at the boundary between the low Si-concentration regions 10a and 10b and the other region (i.e., the region having a relatively high Si concentration). What is important is to ensure that, after a closed space is formed by the cap 3, Si is hardly supplied into the space from the adhesion layer 10 responsive to irradiation of laser light from the laser chip 1.

In the present embodiment, the adhesion layer 10 is irradiated with short-wavelength light, e.g. ultraviolet light. However, the means for removing as much such substance as possible from an element which contains a photochemically-reactive substance (e.g. Si) is not limited to light irradiation. For example, it may be effective to perform a heat treatment instead of light irradiation, or in addition to light irradiation. For example, the cap 3 may be heated to 100 to 600° C. with one end thereof being left open as shown in FIG. 3, and retained so for about 10 to about 60 minutes. Through such a heat treatment, the photochemically-reactive substance can be allowed to vaporize (scatter) off the adhesion layer 10, and a structure similar to the structure shown in FIG. 4 can be imparted to the adhesion layer 10.

As the material of the adhesion layer 10, instead of low-melting point glass, a material from which Si-containing substance is likely to scatter responsive to a heat treatment (a low molecular-weight material such as nitrocellulose or an oxygen-containing substance) may be used.

Embodiment 2

Hereinafter, with reference to FIG. 5, a second embodiment of the semiconductor laser device according to the present invention will be described.

The semiconductor laser device of the present embodiment and the semiconductor laser device of Embodiment 1 have a common structure other than in the differences described below. Therefore, only the differences will be specifically described herein.

In the semiconductor laser device of the present embodiment, in order to prevent contact between the gas (nitrogen gas) that is enclosed in a space which is created by the cap 5 and the adhesion layer 10, a surface of the adhesion layer 10 which otherwise would be exposed on the inside of the cap 5 is coated with a shielding film 20.

The shielding film 20 in the present embodiment serves to ensure that, when a vaporization/separation phenomenon of Si or Si-containing substance occurs in the adhesion layer 10 which has been irradiated with laser light, such Si or Si-containing substance will not leak into the nitrogen gas. Therefore, it is preferable that the shielding film 20 is formed of a material which is dense in texture and exhibits airtightness. For example, a material such as niobium oxide ($Nb_2O_5$) is suitably used as the material of the shielding film 20.

The thickness of the shielding film 20 is to be appropriately selected in the range of about 10 to about 100 nm. If the thickness of the shielding film 20 is below 10 nm, sufficient shielding effects (airtightness) cannot be obtained, which is not preferable. If the thickness of the shielding film 20 becomes thicker than 100 nm, cracks may occur in the shielding film 20, or the shielding film 20 may partially peel, due to differences in the coefficients of thermal expansion or the like.

Although the shielding film 20 may be formed by a lift-off technique or the like, a UV irradiation or heat treatment that has been described with respect to Embodiment 1 may be performed prior to growing the shielding film 20.

On the light-emitting end face of the laser chip 1, various reflective coating films or protective films are grown for reflectance adjustment. Such films are formed of materials which are highly reliable as stable materials that are unlikely to react responsive to laser light. Therefore, it is preferable to form the shielding film 20 from a film which is similar to a film which may be used on the light-emitting end face of the laser chip 1.

The shielding film 20 may be a film which transmits the laser light emitted from the laser chip 1. However, the shielding film 20 may be formed of a material that absorbs or reflects this laser light, in which case the amount of laser light reaching the adhesion layer 10 can be reduced, whereby an effect of suppressing photochemical reaction is obtained. As a material which effectively absorbs the laser light used in the present embodiment, a metal such as gold (Au) is suitably used, for example. In the case where the shielding film 20 is formed of a material which reflects the laser light, returned light to the laser chip 1 may occur, thus causing noise. Therefore, in the case where the shielding film 20 is formed of a reflective material, it is preferable to design the shape or size of the shielding film so that the reflected light is unlikely to return to the laser chip 1.

The shielding film 20 may have a multilayer structure or a composite structure. For example, a shielding film 20 having a multilayer structure may be formed by stacking a metal layer which reflects laser light and a resin layer which absorbs laser light. Moreover, a shielding film 20 having a composite structure may be formed by dispersing minute metal microparticles in the insulative film, for example. Note that the surface of the shielding film 20 does not need to be flat, but may have minute bumps and dents formed thereon so as to exhibit a light scattering ability.

Figure 5:
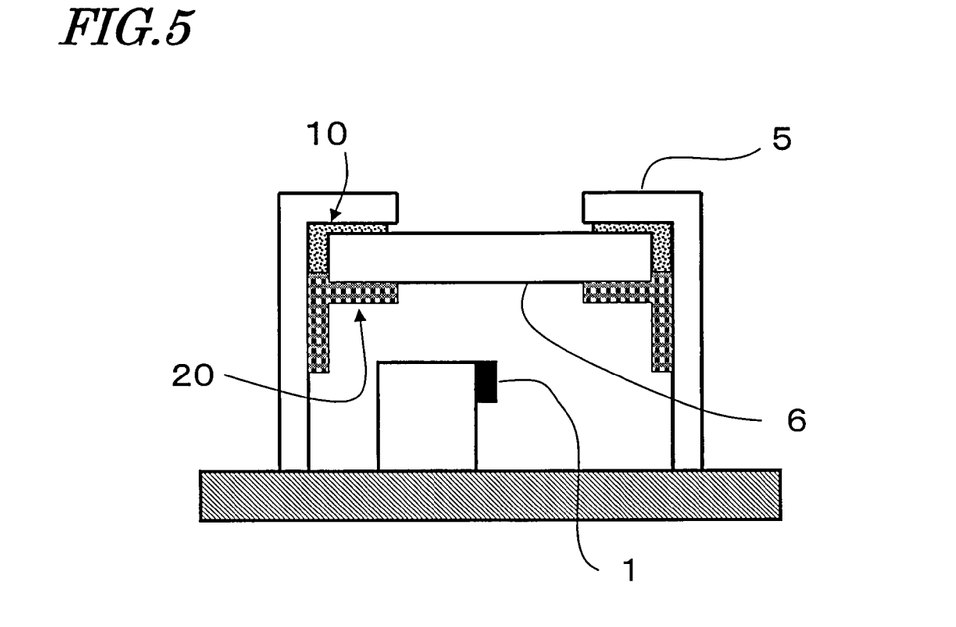
FIG. 5 A cross-sectional view showing a main portion of a semiconductor laser device according to Embodiment 2.

In the case where the shielding film 20 is formed of a material which absorbs or reflects laser light, the shielding film 20 should not be provided in the region which is supposed to transmit the laser light, as shown in FIG. 5. However, in the case where the shielding film 20 is formed of a material which is transparent with respect to the laser light, the entire surface of the optical window 4 may be coated with the shielding film 20.

Thus, the present invention has been described with respect to an embodiment where the optical window 6 is adhered to the cap 5 by means of the adhesion layer 10 of low-melting point glass which contains Si. However, the present invention is not limited to such cases. The adhesion layer 10 of low-melting point glass which contains Si may be used to adhere any element other than the optical window 6 inside the package.

Embodiment 3

Hereinafter, still another embodiment of the semiconductor laser device according to the present invention will be described.

As has been described with respect to the first embodiment by referring to FIG. 3, irradiating the cap 5 with ultraviolet light to reduce the concentration of Si-containing substance in the adhesion layer 10 for the cap 5 is effective for increasing the life of a semiconductor laser device. However, the inventors have found through further studies that, when the package is made small (that is, the upper face size of the base 4 is reduced), ultraviolet irradiation for the cap 5 alone may not be able to adequately suppress the deposition of foreign matter on the light-emitting end face of the laser chip. The problems which would occur when the package is thus made small and a method for solving them will be described below.

First, FIG. 1 is referred to. As shown in FIG. 1, the base 4 has a plurality of terminal electrodes (lead pins) 7 fixed thereto. Among these terminal electrodes 7, two terminal electrodes 7 are inserted in the throughholes which are provided in the base 4, and are affixed to the base 4 via low-melting point insulation glass (shield glass) 8.

The cap 5 is fused to the base 4 via high electric-field press. In a high electric-field press apparatus, the elements near the fused portion are formed of copper (Cu), which has a high thermal conductivity, and also ice-cooling is performed in order to prevent tremendous heat from flowing into the base 4 during fusing. However, the fused element at the periphery of the cap 5 is formed of a material such as Kovar, whose melting point is as high as about 1000° C., and therefore temperature increase in the fused portion is inevitable. As a result, if the base 4 is made small, there emerges a possibility that the temperature of the insulation glass 8 that is present around the terminal electrodes 7 may have a drastic local increase due to the heat when fusing the cap 5 to the base 4. However, since a base 4 having 5.6 mmφ is used in Embodiment 1, the distance between the peripheral edge of the cap 5 and the outer peripheral surface of the insulation glass 8 is about 100 to about 150 μm. In such a case, it is considered that the temperature of the insulation glass 8 around the terminal electrodes 7 will not far exceed about 700° C. even when the cap 5 is fused to the base 4. However, in the case where the base 4 has an outer diameter of about 3 mmφ, for example, the distance between the insulation glass 8 and the peripheral edge of the cap 5 is reduced to about 50 μm or less. In such a case, the temperature of the insulation glass 8 may be greatly increased above about 700° C., and it is presumed that the Si-containing substance which was contained in the insulation glass will be released prominently.

Figure 7:
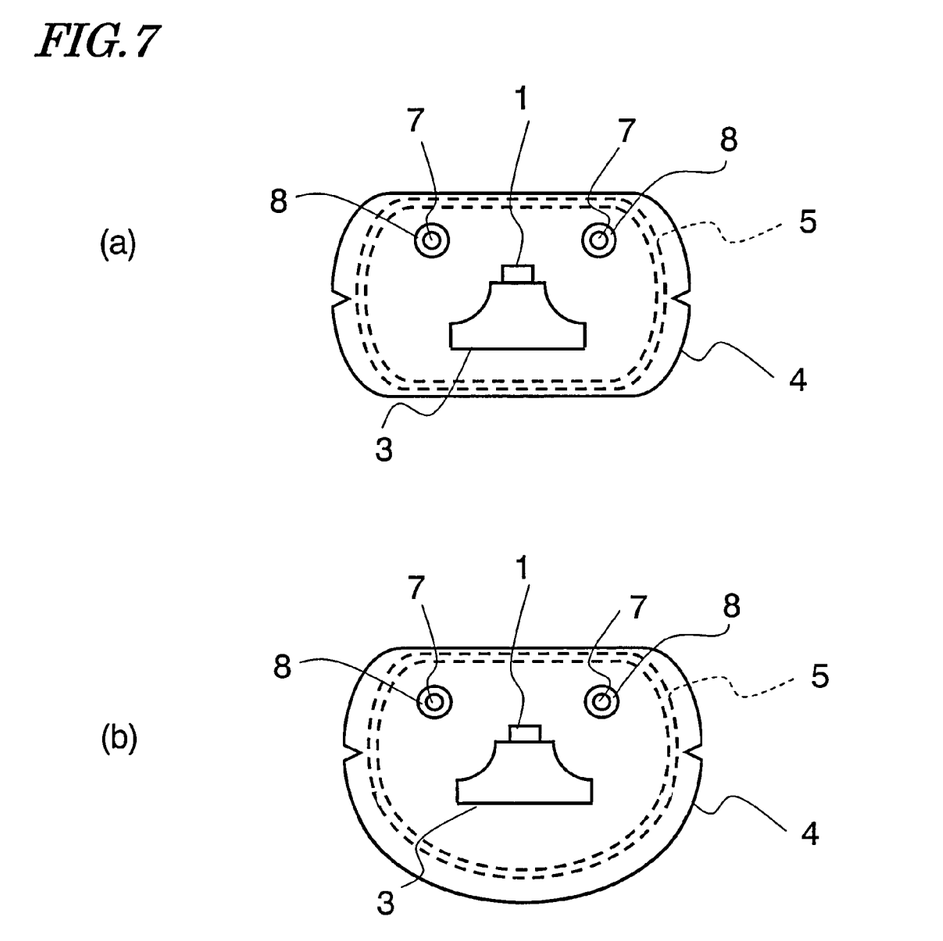

FIGS. 7(a) and (b) are plan views showing upper faces of the bases of an I-cut type package and a half-cut type package, respectively, which are small packages. In such bases 4, the distance between the terminal electrodes 7 and the inner peripheral edge of the cap 5 (broken lines) is short, so that the insulation glass 8 around the terminal electrodes 7 is likely to be locally increased in temperature due to the heat when fusing the cap 5 to the base 4. In such types of packages, irrespective of their sizes, the insulation glass 8 which is located near the terminal electrodes 7 is likely to be heated when fusing the cap 5 to the base 4, and therefore Si-containing substance is likely to be released.

Figure 8:
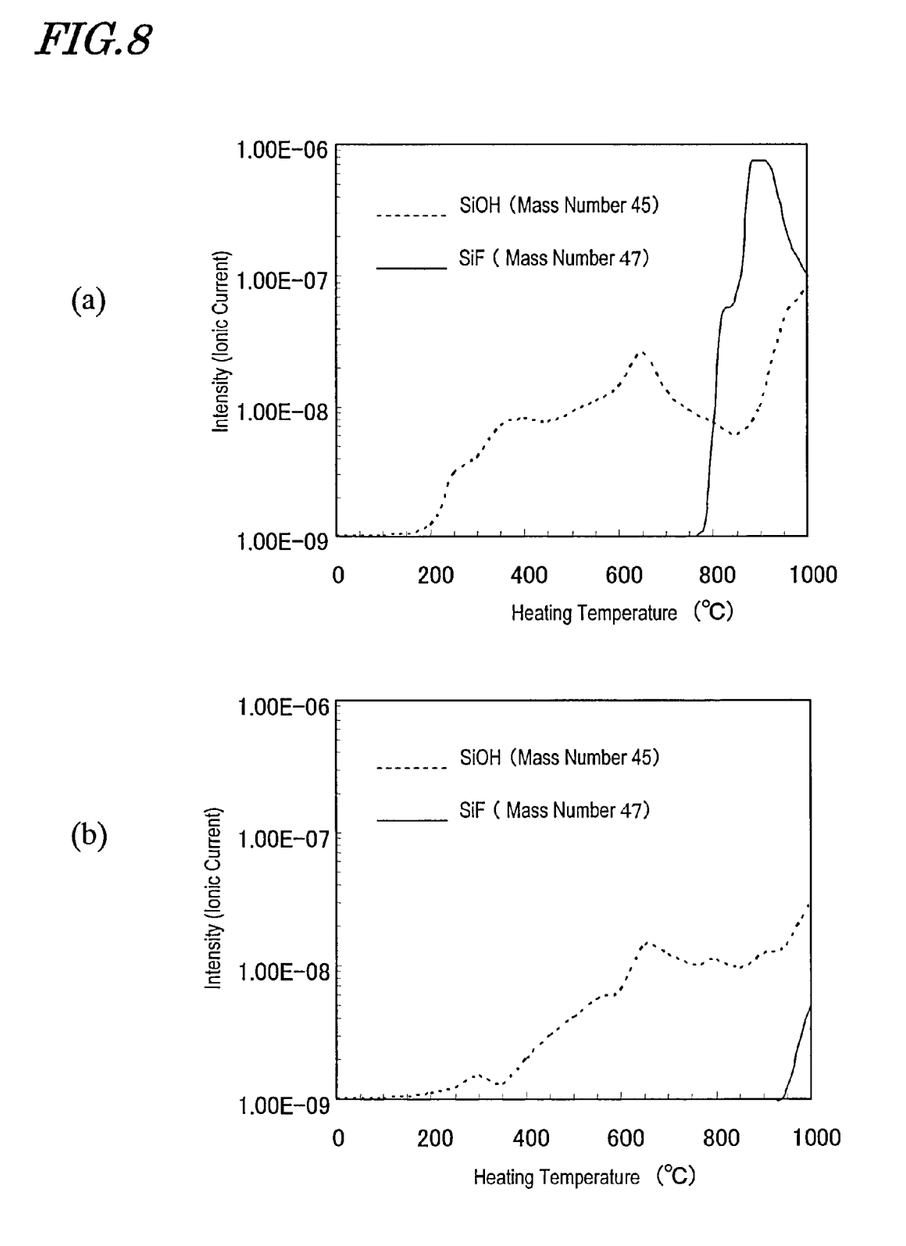

FIG. 8(a) is a graph showing the relationship between: a heating temperature of a 5.6 mmφ stem containing low-melting point insulation glass to which silicon fluoride ($SiF_x$, $x \geq 1$) has been added in order to lower its melting point; and the detected intensities of Si-containing substances (SiOH, $SiF_x$) released from this stem. The horizontal axis is the heating temperature, whereas the vertical axis is the detected intensity of gas. After a container in which the stem had been placed was evacuated to a vacuum state, the stem in the container was heated from room temperature to 1000° C., at a temperature elevation rate of 50° C./minute, and the gas (degas) emerging from the stem was detected with a mass spectroscope.

Note that FIGS. 8(a) and (b) illustrate SiOH having a mass number of 45, as a representative example of siloxane, and SiF having a mass number of 47, as a representative example of silicon fluoride. It can be seen that, when the heating temperature is 700° C. or less, SiOH (a kind of siloxane) is released from the stem, but $SiF_x$ ($x \geq 1$, $x=1.3$ in the experiment) is not released. On the other hand, when the heating temperature is increased above 700° C., the releasing of $SiF_x$ from the stem (insulation glass) becomes vigorous and dominant. Note that "siloxane" refers to organic or inorganic compounds whose main component is silicon and oxygen, where $D_2SiO$ is the basic structural unit. Herein, D is an alkyl group (which usually is a methyl group).

FIG. 8(b) is a graph showing the relationship between: a heating temperature of a stem containing (high-melting point) insulation glass which contains no $SiF_x$; and the detected intensities of Si-containing substances (SiOH, $SiF_x$) released from this stem. As shown in FIG. 8(b), irrespective of the heating temperature, the release of $SiF_x$ was greatly reduced.

As can be seen from the above description, in the case where the insulation glass 8 around the terminal electrodes 7 contains $SiF_x$, releasing of $SiF_x$ will be suppressed unless the neighborhood of the terminal electrodes 7 is heated to a temperature above 700° C. Therefore, in the case where the package is large, the releasing of $SiF_x$ from the insulation glass around the terminal electrodes 7 is not so significant. Note that, in the case where insulation glass containing no $SiF_x$ is used as such insulation glass, releasing of Si-containing substance (e.g. siloxane) can be suppressed to be relatively low, so long as the heating temperature is kept to 800° C. or less.

It can be seen from the above that, in the case where the base 4 has an outer diameter of 5 mmφ or less, or where an I-type package or a half-cut type package is adopted, the insulation glass 8 used around the terminal electrodes 7 is likely to release $SiF_x$, thus leading to the problem of shorted lifespan of the semiconductor laser device. In order to solve this problem, various countermeasures as described above are taken in the present embodiment.

Firstly, in the present embodiment, after affixing the terminal electrodes 7 to the base 4 via usual low-melting point insulation glass 8, special treatments for reducing the $SiF_x$ concentration in the insulation glass 8 are performed. Specifically, hexane cleaning and UV irradiation are performed for the base 4 (the portion of the insulation glass 8 present near the terminal electrodes 7). Experimentation by the inventors has revealed that hexane cleaning is very effective for removal of $SiF_x$. By performing hexane cleaning for the base 4, the amount of $SiF_x$ released from the insulation glass due to the heat when fusing the cap can be reduced to 1/10 or less. Moreover, at this time, the silicon fluoride concentration at the surface of the insulation glass that comes in contact with the ambient gas is 1/10 or less of the concentration in the interior. Such hexane cleaning is also effective for removing the siloxane which has deposited on the surface of the stem including the base 4. Therefore, it is preferable to perform hexane cleaning for the cap 5 and the like, together with UV irradiation.

According to the present embodiment, since the concentration of the $SiF_x$ that is present on the base 4 is reduced before fusing the cap 5 to the base 4, the released amount of $SiF_x$ from the insulation glass or the like is greatly reduced even if the neighborhood of the terminal electrodes 7 reaches a high temperature above 700° C. (e.g. 900° C.) when fusing the cap 5 to the base 4. Therefore, deterioration of the light-emitting end face of the laser chip in the package is suppressed. As a result, even in the case where the interval between the position at which the cap 5 is fused to the surface of the base 4 and the outer peripheral surface of the insulation glass 8 is 50 μm or less, the lifespan of the semiconductor laser device can be effectively prolonged to a practical level. Specifically, the total amount of $SiF_x$ which is released when heated to a temperature of no less than 750° C. and no more than 850° C. is preferably equal to or less than 1.0 μg, and more preferably equal to or less than 0.1 μg.

Note that, although the present embodiment employs insulation glass containing $SiF_x$, it is always preferable to use insulation glass which contains no $SiF_x$ for affixing the terminal electrodes 7 to the base 4. Although the melting point of insulation glass which contains no $SiF_x$ will be higher than the melting point of insulation glass containing $SiF_x$, it is preferable to use insulation glass which contains substantially no $SiF_x$ for the sake of preventing deterioration of the light-emitting end face of the laser chip. Even in this case, it is desirable to perform hexane cleaning and UV irradiation for the entire stem including the base 4. The reason is that, on the stem surface, there may be some Si-containing substance which is derived from origins other than the insulation glass, e.g., external contamination during plating (Ni plating or Au plating) of the stem surface or during stem transportation. Removing such Si-containing substance from the stem surface as much as possible would contribute to prolongation of the lifespan of the semiconductor laser device.

Although the gas enclosed in the package according to Embodiments 1 to 3 is nitrogen gas, any gas in which oxygen is mixed (e.g. air) may be used as the enclosed gas because, if oxygen is mixed, the effect of suppressing deposition of foreign matter on the laser-emitting end face will be more prominent. The reason is that, since oxygen is active with respect to the wavelength of laser light (500 nm or less), oxygen will react before the Si that has been decomposed through photochemical reaction is deposited on the laser end face, thus exhibiting gettering effects. Similar gettering effects can be exhibited by any gas which is active with respect to laser light (with a wavelength equal to or less than 500 nm), i.e., any gas which undergoes a photochemical reaction and is decomposed responsive to laser light whose wavelength is equal to or less than 500 nm (e.g. fluorine or chlorine). Any such gas may be added in addition to oxygen, or instead of oxygen.

It will be clear from the above descriptions that, as the wavelength of laser light becomes shorter than 500 nm, reassessment of various materials which would not conventionally have presented any problems will become necessary. For example, materials such as low-melting point glass containing Si are used for the optical system (optical system parts such as lenses) which is included in the optical disk apparatus. Therefore, if any Si-containing substance is present in the optical path of the laser light which is emitted from the semiconductor laser device, or in a region which is not in the optical path but receives scattered light (stray light), Si may be released due to laser light irradiation and deposited on the surface of optical system parts such as lenses. Therefore, it is desirable that any element that is formed of a material containing a substance which undergoes a photochemical reaction responsive to laser light be coated with a film that is composed of a stable material which is not susceptible to photochemical reaction; modified (especially modified at the surface) so as to become immune to photochemical reaction; or placed outside of the region which is irradiated with laser light.

Although the above descriptions have only been directed to the cases where the substance which undergoes a photochemical reaction responsive to laser light is Si, the present invention is not limited to such cases. The present invention is also effective in the case where any other substance, such as hydrocarbon (C), is released responsive to laser light and deposited on the light-emitting end face of a laser chip.

INDUSTRIAL APPLICABILITY

The semiconductor laser device according to the present invention can be used as a light source for various electronic devices (e.g. optical disk apparatuses) which require short-wavelength laser light having a wavelength equal to or less than 500 nm, and enhance the reliability of the devices.

The invention claimed is:

1. A semiconductor laser device comprising:
a semiconductor laser chip for emitting laser light;
a stem for supporting the semiconductor laser chip;
a plurality of terminal electrodes, inserted in throughholes provided in the stem, for supplying power to the semiconductor laser chip;
a cap having an optical window which transmits laser light and being affixed to the stem so as to cover the semiconductor laser chip; and
insulation glass provided between the stem and the terminal electrodes, wherein, in the insulation glass, a concentration of silicon fluoride at a surface which is in contact with the ambient gas is $\frac{1}{10}$ or less of a concentration of silicon fluoride in the interior of the insulation glass, and wherein,
a total amount of silicon fluoride gas which is released when the insulation glass is heated to a temperature of no less than 700° C. and no more than 850° C. is equal to or less than 1.0 μg.

2. The semiconductor laser device of claim 1, wherein an interval between an inner peripheral edge of the cap and an outer peripheral surface of the insulation glass is equal to or less than 50 μm.

3. The semiconductor laser device of claim 1, wherein a wavelength of the laser light is equal to or less than 500 nm.

4. The semiconductor laser device of claim 1, wherein the ambient gas is nitrogen gas and/or inert gas.

5. The semiconductor laser device of claim 1, wherein the ambient gas contains oxygen gas.

6. An optical disk apparatus comprising:
the semiconductor laser device of claim 1; and
an optical system for converging laser light which is emitted from the semiconductor laser device onto an optical disk.

7. The optical disk apparatus of claim 6, wherein, in any region which is irradiated with the laser light, no element is provided that is formed of a material containing a substance which undergoes a photochemical reaction responsive to laser light.

8. A method for producing a semiconductor laser device including: a semiconductor laser chip for emitting laser light; a stem for supporting the semiconductor laser chip; a plurality of terminal electrodes, inserted in throughholes provided in the stem, for supplying power to the semiconductor laser chip; and a cap having an optical window which transmits laser light and being affixed to the stem so as to cover the semiconductor laser chip, comprising:
step (A) of insulating the terminal electrodes from the stem with insulation glass wherein, in the insulation glass, a concentration of silicon fluoride at a surface which is in contact with the ambient gas is $\frac{1}{10}$ or less of a concentration of silicon fluoride in the interior of the insulation glass, and wherein the insulation glass does not release silicon fluoride gas when heated to a temperature of no less than 700° C. and no more than 850° C.; and
step (B) of affixing the cap to the stem.

9. The production method of claim 8, wherein, between step (A) and step (B), a step of washing a surface of the stem and the cap with hexane is performed.

10. The production method of claim 8, wherein, between step (A) and step (B), a step of irradiating a surface of the stem and the cap with light having a wavelength equal to or less than 500 nm is performed.

* * * * *